United States Patent [19]

Sakurai

[11] 4,403,400
[45] Sep. 13, 1983

[54] PROCESS FOR PRODUCING A SEMICONDUCTOR DEVICE

[75] Inventor: Junji Sakurai, Tokyo, Japan

[73] Assignee: Fujitsu Limited, Kawasaki, Japan

[21] Appl. No.: 347,586

[22] Filed: Feb. 10, 1982

[30] Foreign Application Priority Data

Feb. 17, 1981 [JP] Japan .................................. 56-22005

[51] Int. Cl.³ ............................................ H01L 21/74
[52] U.S. Cl. ................................. 29/576 B; 29/576 E; 29/578; 148/1.5; 148/191
[58] Field of Search ................. 29/576 B, 576 E, 578; 148/1.5, 188, 191

[56] References Cited

U.S. PATENT DOCUMENTS 4,170,501 10/1979 Khajezadeh .................... 148/191 X

OTHER PUBLICATIONS

Joshi, M. L., et al., "Masking Technique for Laser Induced Diffusion", in *IBM-TDB*, vol. 13, No. 4, Sep. 1970, p. 928.

Primary Examiner—L. Dewayne Rutledge
Assistant Examiner—Alan E. Schiavelli
Attorney, Agent, or Firm—Staas & Halsey

[57] ABSTRACT

In a process for producing a semiconductor device, buried regions are formed within the semiconductor substrate by introducing an impurity, an epitaxial layer is formed on the buried regions, and an energy beam is selectively irradiated on the surface of the epitaxial layer.

15 Claims, 8 Drawing Figures

PROCESS FOR PRODUCING A SEMICONDUCTOR DEVICE

BACKGROUND OF THE INVENTION

The present invention relates to a process for producing a semiconductor device, more particularly to a process for producing a bipolar type semiconductor device. In prior art integrated circuits (IC) of bipolar type semiconductor devices, integrated injection logic (I²L) and other circuits which are operated under a low tolerance voltage and at a high operating speed, and linear IC's and other circuits which can be operated under a high tolerance voltage, are often provided on the same chip. In such a case, as shown in FIG. 1, it is preferable that in the I²L element region 1, the distance $d_1$ between P type regions 6, 7 and 8 and the N+ type buried region $N^+b_1$ be as small as possible so as to obtain a high operation speed. It is also preferble that in the linear element region 2, the distance $d_2$, between the P type region 9 and the N+ type buried region $N^+b_2$, be somewhat large so as to obtain a high tolerance voltage. In the FIG. 1, reference numerals 4 and 5 show a P type semiconductor substrate and N+ region, respectively.

In forming a bipolar type semiconductor device having the above-mentioned conventional structure, as shown in FIG. 2a, N type impurities having different diffusion coefficients, such as arsenic (As) and phosphorus (P), are introduced into the I²L element region 1 and linear IC element region 2 to form the N+ type diffusion regions $N^+_{AS}$ and $N^+_P$ within the P type semiconductor substrate 4.

Then, as shown in FIG. 2b, as shown in FIG. 2b, an N type epitaxial layer 3 having a required thickness is formed on the P type semiconductor substrate 4 by chemical vapour deposition at a temperature of 1000° C. to 1200° C. Since the diffusion coefficient of arsenic is different from that of phosphorus, the amount of arsenic diffused in the $N^+_{AS}$ type region differs from that of phosphorus. Thus, the N+ buried regions $N^+b_1$ and $N^+b_2$, are formed, with a different thickness between the P type epitaxial layer 4 and N type epitaxial layer 3. Thickness $t_1$ and $t_2$, the distance between the surface of the N type epitaxial layer 3 and the $N^+b_1$ region and between the surface of the N type epitaxial layer 3 and the $N^+b_2$ layer, respectively are then adjusted.

Next, as shown in FIG. 2c, P type impurities are simultaneously diffused under the same conditions in the desired regions of both element regions 1 and 2 on the N type epitaxial layer 3 so as to form P type regions 6, 7, 8 and 9, all having the same required depth, within the N type epitaxial layer 3. The distance $d_1$ between the P type regions 6, 7, 8, and the buried regions $N^+b_1$ and the distance $d_2$ between P type region 9 and buried region $N^+b_2$ are then adjusted.

However, the above conventional process requires two photo processing steps and two diffusion processing steps to form N+ type diffusion regions $N^+_{AS}$ and $N^+_P$ for the formation of buried regions, so that the processes are complex. Further it suffers from the disadvantage that the phosphorus which is used in forming the buried region has a large autodoping effect to the N epitaxial layer 3. The concentration of phosphorus in the N+ diffusion region $N^+_P$ must be limited to keep the amount of autodoping below the tolerance, thus there is the problem that one cannot obtain the resistance value of the buried region $N^+b_1$ most suitable for the element characteristic. Further, there is the problem that the large diffusion coefficient of the phosphorus makes it very difficult to control the diffusion in the vertical direction.

SUMMARY OF THE INVENTION

It is an object of the present invention to provide a process for producing a bipolar IC semiconductor device having a structure wherein a circuit which can be operated under a low tolerance voltage and at a high operating speed, such as an I²L device, and a circuit which can be operated under a high tolerance voltage, such as a linear IC, are provided on the same chip.

It is another object of the present invention to provide a process for providing a semiconductor device wherein the resistance value of the buried region most suitable for the characteristics of an element can be obtained.

It is a further object of the present invention to provide a process for producing a semiconductor device wherein a required amount of impurity introduced onto a buried region can be diffused upwardly.

The above-mentioned objects of the present invention are attained by a process for producing a semiconductor device comprising the steps of: forming buried regions within a semiconductor substrate by introducing an impurity; forming an epitaxial layer on the semiconductor substrate to cover the buried regions; and selectively irradiating the surface of the epitaxial layer with an energy beam to cause upward diffusion of the impurity from at least one of said buried regions into said epitaxial layer.

BRIEF DESCRIPTION OF THE DRAWINGS

The present invention is explained in detail with reference to the drawings, wherein.

DETAILED DESCRIPTION OF THE PREFERRED EMBODIMENT

Figure 3A:
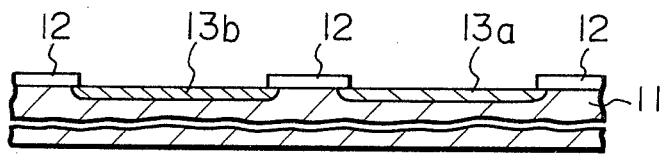
FIG. 3a to FIG. 3d are cross-sectional views for illustrating the process according to the present invention.

As shown in FIG. 3a, first a P type silicon substrate 11 having a specific resistivity of, for example 0.5 to 1 ohm-cm is formed. A silicon dioxide film 12 is then formed on the P type silicon substrate 11 by thermal oxidation at a temperature of about 1100° C. The required windows are formed on the portions of the silicon dioxide film 12 by the well-known photolithography technique. Gas diffusion of antimony, which does not cause any significant auto-doping in the succeeding epitaxial process, is then carried out using the silicon dioxide as a masking film so as to form N+ diffusion regions 13a and 13b having an antimony concentration of $10^{19}$ to $10^{20}$ atm/cm² and an antimony diffusion depth of 2 to 3 μm. The silicon dioxide film 12 is removed by wet etching, then an N-type silicon epitaxial layer 14 having a thickness of 3 μm is formed on the P type silicon substrate 11, including the N+ diffusion region, by a silicon epitaxial growth process carried out by the thermal decomposition of monosilane (SiH$_4$) and phosphine (PH$_3$).

Figure 3B:
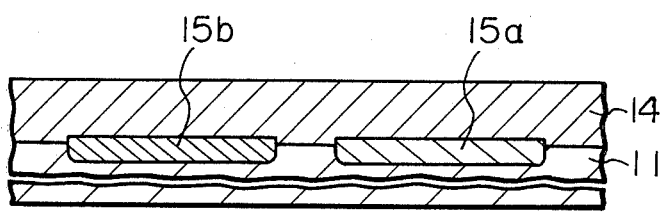

In this epitaxial growth process, the antimony in the N+ type diffusion regions 13a and 13b is diffused into the N− type silicon epitaxial layer 14 and the P type silicon substrate 11 for a thickness of 0.2 to 0.3 μm. Thus, the N+ buried regions 15a and 15b including the diffused region are formed, as shown in FIG. 3b.

Figure 3C:
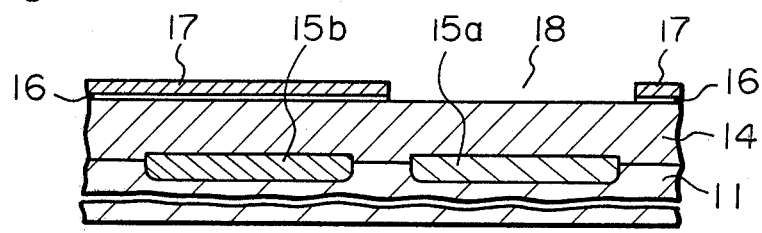

As shown in FIG. 3c, a silicon dioxide film 16 having a small thickness of 1000 A, is then formed by the well known thermal oxidation process on the N− type silicon epitaxial layer 14. A material having a thickness of 1 μm and serving as a shield against laser beams, electron beams, ion beams, and other energy beams, such as aluminum film 17, is formed on the silicon dioxide film 16. A window 18 for exposing the epitaxial layer 14 to energy beams, is formed by the photoetching process, on the regions which cover the required buried layer 15a, in the aluminum film and the silicon dioxide film 16. The window 18 through which energy beams are irradiated exposes the N− type silicon epitaxial layer 14.

Figure 3D:
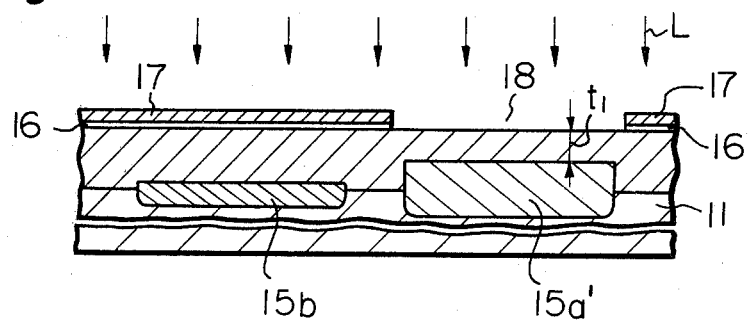

As shown in FIG. 3d, the entire surface of the substrate is scanned with laser beam L, in which the beam spot diameter is 50 μmϕ, the power output is 4 W, and the scanning speed is 2 cm/sec. Thus, the N− type silicon epitaxial layer 14, which is exposed by the window 18 for radiating energy beams, is selectively heated at a temperature of 1000° C. to 1400° C., with the result that the antimony in the buried region 15a under the region exposed by the window 18 is diffused upwardly at required length, for example 1.5 to 2 μm, thereby forming the buried region 15a' which its upper surface at the required depth $t_1$ from the surface of the epitaxial layer 14. However, since the region where the other buried layer 15b is formed, is shielded by the aluminum film 17 from the laser beam during the scanning of the beam, the buried region 15b is not expanded by diffusion. It is preferable that the energy used in the energy beam scanning be limited to the range in which the epitaxial layer 14 is not melted. Another method of heating the buried layer is to selectively scan the required region of the surface of the epitaxial layer by an energy beam without using a mask to shield other regions from the energy beam. One example of a process for selective scanning with an energy beam is to use an electron beam in which the beam spot diameter is 40 μm, the beam acceleration voltage is 50 KV, the beam electric current is 100 μA, and the scanning speed is In this process only the required regions are scanned, using the raster scanning process or the vector scanning process. The above-mentioned selective heating of the regions has the same effect as in the first example.

In the selective heating using energy beams as in the above examples, the epitaxial layer and the buried region are heated by the energy beam in the vertical direction. Therefore, the portions of the epitaxial layer and the buried region in the energy beam irradiation region are heated to the required high temperature while other portions of the epitaxial layer and the buried region outside the energy beam irradiation region are not increased in temperature at all. Thus, the impurity introduced into the buried layer of the required region can be selectively diffused upwardly in the epitaxial layer.

Further, since the rise in temperature in the energy beam irradiation region is defined by the strength of the energy beam, one can precisely control the diffusion of the impurity introduced into the buried layer.

In the above examples, an explanation was given on how to make just the required buried regions of a plurality of separated buried region diffuse in an epitaxial layer. However, according to the present invention, it is also possible to make only the required region of a single buried portion diffuse in a step form or to form a buried layer having an inclination.

As explained above, according to the present invention, the required ones of the buried regions, formed by doping an impurity having a low diffusion coefficient and a small amount of autodoping, can be precisely diffused within an epitaxial layer. Therefore, one can improve the properties of a bipolar IC semiconductor device having a structure wherein a circuit which can be operated under a low tolerance voltage and at a high operating speed, such as I$^2$L, and a circuit which can be operated under a high tolerance voltage, such as a linear IC, are provided on the same chip, and can further improve the production yield of the semiconductor device.

I claim:

1. A process for producing a semiconductor device on a semiconductor substrate, comprising the steps of:
   (a) forming buried regions within the semiconductor substrate by introducing an impurity;
   (b) forming an epitaxial layer, having a surface, on the semiconductor substrate and the buried regions; and
   (c) selectively irradiating the surface of the epitaxial layer with an energy beam to cause diffusion of the impurity from at least one of the buried regions into the epitaxial layer.

2. A process according to claim 1, wherein the semiconductor substrate comprises a silicon wafer of a first conductivity type.

3. A process according to claim 1, wherein the first conductivity type is P-type.

4. A process according to claim 1, wherein the semiconductor substrate is of a first conductivity type and the buried regions are of a second conductivity type which is opposite to the first conductivity type.

5. A process according to claim 4, wherein the second conductivity type is N-type.

6. A process according to claim 1, wherein said selective energy irradiation step (c) comprises masking the surface of the epitaxial layer with a masking film made of material which blocks the energy beam.

7. A process according to claim 1, wherein said selective energy irradiation step (c) comprises selectively scanning the beam on only a required portion of the surface of the epitaxial layer.

8. A process according to claim 1, the wherein impurity introduced in said step (a) is at least one selected from the group of antimony (Sb), arsenic (As), and phosphorus (P).

9. A process for producing a semiconductor device on a semiconductor substrate, comprising the steps of:
   (a) forming first and second buried regions within the semiconductor substrate by introducing first and second impurities, respectively, into the semiconductor substrate;
   (b) forming an epitaxial layer, having a surface, on the semiconductor substrate and the first and second buried regions; and
   (c) selectively irradiating the surface of the epitaxial layer with an energy beam to diffuse at least one of the first and second impurities from at least one of the first and second buried regions into the epitaxial layer.

10. A process according to claim 9, wherein said selective irradiating step (c) comprises selectively irradiating the surface of the epitaxial layer with an energy beam to diffuse the first impurity from the first buried region into the epitaxial layer, so that the thickness of the first buried region varies lineary along its length.

11. A process according to claim 9, wherein said selective irradiating step (c) comprises selectively irradiating the surface of the epitaxial layer with an energy beam to diffuse the impurity from a first portion of the first buried region into the epitaxial layer, so that the first portion of the first buried region has a first thickness and a second portion of the first buried region has a second thickness which is less than said first thickness.

12. A process according to claim 9, 10, or 11, wherein said selective irradiating step (c) comprises masking the surface of the epitaxial layer with a masking film impervious to the energy beam and irradiating the unmasked portion of the surface of the epitaxial layer so as to diffuse the first impurity from the first buried region into the epitaxial layer.

13. A process according to claim 9, 10, or 11, wherein said selective irradiating step (c) comprises selectively scanning the energy beam on the portion of the surface of the epitaxial layer overlying the first buried region.

14. A process according to claim 9, wherein the first and second impurities are selected from the group consisting of antimony (Sb), arsenic (As) and phosphorus (P).

15. A process according to claim 9, wherein said forming step (a) comprises the step of gas diffusing antimony into the semiconductor substrate.

* * * * *

UNITED STATES PATENT AND TRADEMARK OFFICE
CERTIFICATE OF CORRECTION

PATENT NO. : 4,403,400
DATED      : September 13, 1983
INVENTOR(S) : Sakurai

It is certified that error appears in the above-identified patent and that said Letters Patent is hereby corrected as shown below:

Front page, [56] References Cited
   line 6, "vol." should be --Vol.--.

Figure 1:
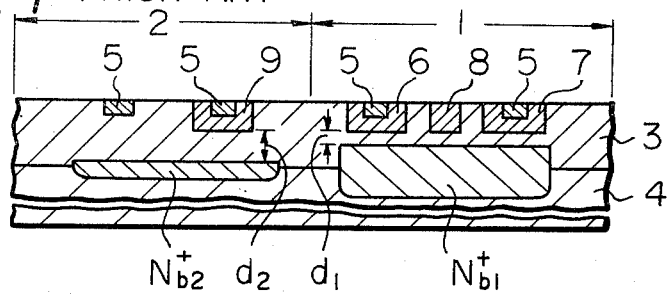
FIG. 1 is a cross-sectional view of an example of a prior art bipolar IC wherein a circuit which can be operated under a low tolerance voltage and at a high operating speed and a circuit which can be operated under a high tolerance, are provided together.
Figure 2A:
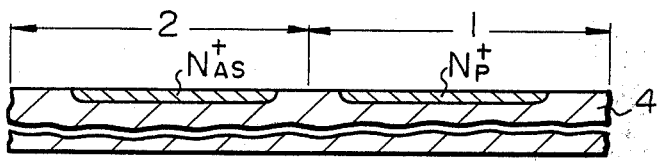
FIG. 2a to FIG. 2c are cross-sectional views for illustrating the process of the prior art.
Figure 2B:
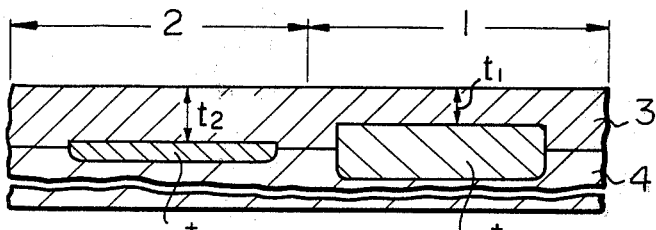
Figure 2C:
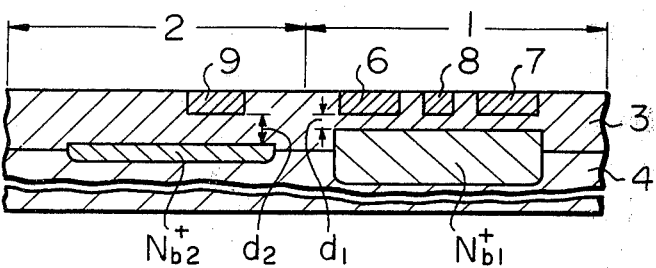

Column 1, line 19, "preferble" should be --preferable--;
         line 22, delete "the";
         line 33, delete "as shown in FIG. 2b," (2nd occurrence).

Column 3, line 10, "1000 A" should be --1000 Å--;
         line 32, "which its" should be --having an--;
         line 48, after "is" (second occurrence) insert
--5 mm/sec.--.

Column 4, line 5, "region" should be --portion--.

Signed and Sealed this

Seventeenth Day of April 1984

[SEAL]

Attest:

GERALD J. MOSSINGHOFF

Attesting Officer    Commissioner of Patents and Trademarks